(12) United States Patent
Nishikawa et al.

(10) Patent No.: US 7,498,738 B2
(45) Date of Patent: Mar. 3, 2009

(54) ORGANIC EL ELEMENT AND ORGANIC EL PANEL

(75) Inventors: Ryuji Nishikawa, Gifu (JP); Tetsuji Omura, Ogaki (JP)

(73) Assignee: Sanyo Electric Co., Ltd. (JP)

( * ) Notice: Subject to any disclaimer, the term of this patent is extended or adjusted under 35 U.S.C. 154(b) by 445 days.

(21) Appl. No.: 10/952,645

(22) Filed: Sep. 29, 2004

(65) Prior Publication Data

US 2005/0067945 A1 Mar. 31, 2005

(30) Foreign Application Priority Data

Sep. 30, 2003 (JP) ............................. 2003-342663

(51) Int. Cl.
H05B 33/22 (2006.01)
(52) U.S. Cl. ........................ 313/504; 313/509
(58) Field of Classification Search ......... 313/498–512; 315/169.3; 345/36, 45, 76
See application file for complete search history.

(56) References Cited

U.S. PATENT DOCUMENTS

| | | | |
|---|---|---|---|
| 5,405,710 A | 4/1995 | Dodabalapur et al. | |
| 5,554,911 A | 9/1996 | Nakayama et al. | |
| 5,757,126 A | 5/1998 | Harvey, III et al. | |
| 6,111,270 A | 8/2000 | Xu et al. | |
| 6,445,005 B1 | 9/2002 | Yamazaki et al. | |
| 6,505,901 B1 | 1/2003 | Fukuda | |
| 6,639,250 B1 | 10/2003 | Shimoda et al. | |
| 6,670,772 B1 | 12/2003 | Arnold et al. | |
| 6,710,541 B2 | 3/2004 | He et al. | |
| 6,737,800 B1 | 5/2004 | Winters et al. | |
| 6,812,637 B2 * | 11/2004 | Cok et al. | 313/503 |
| 6,841,803 B2 | 1/2005 | Aizawa et al. | |
| 6,906,457 B2 | 6/2005 | Song et al. | |
| 2002/0113548 A1 | 8/2002 | Silvernail | |
| 2003/0146696 A1 | 8/2003 | Park et al. | |
| 2003/0160564 A1 * | 8/2003 | Park et al. | 313/512 |
| 2004/0051447 A1 * | 3/2004 | Okinaka et al. | 313/504 |
| 2005/0040756 A1 | 2/2005 | Winters et al. | |

(Continued)

FOREIGN PATENT DOCUMENTS

EP 0 615 401 9/1994

(Continued)

OTHER PUBLICATIONS

Notice of Grounds for Rejection for Korean Patent Application No. 10-2005-52411 with English translation mailed Oct. 20, 2006.

(Continued)

*Primary Examiner*—Nimeshkumar D. Patel
*Assistant Examiner*—Christopher M Raabe
(74) *Attorney, Agent, or Firm*—Cantor Colbrun LLP

(57) ABSTRACT

A semi-transmissive film is provided underneath a transparent electrode of an organic EL element. The optical length of the interval between the upper surface of the semi-transmissive film and the lower surface of a counter electrode serving as a reflective layer is configured such that this interval functions as a microresonator for selecting light having a specific wavelength. Further, a light-shielding film is provided in a position corresponding to the peripheral portion of the semi-transmissive film, so as to prevent light having a different color from being ejected due to non-uniformity in the optical length.

6 Claims, 5 Drawing Sheets

U.S. PATENT DOCUMENTS

| | | |
|---|---|---|
| 2005/0067954 A1 | 3/2005 | Nishikawa et al. |
| 2005/0073228 A1 | 4/2005 | Tyan et al. |
| 2005/0088085 A1 | 4/2005 | Nishikawa et al. |
| 2005/0099113 A1 | 5/2005 | Yamada |

FOREIGN PATENT DOCUMENTS

| | | |
|---|---|---|
| JP | 8-8061 | 1/1996 |
| JP | 2003-187975 | 7/2003 |
| WO | 00-76010 A1 | 12/2000 |

OTHER PUBLICATIONS

Office Action dated Aug. 3, 2006 for related U.S. Appl. No. 10/953,667 (Our ref. YKI-0165).

Office Action for corresponding Korean Patent Application No. 10-2004-77132, mailed Apr. 26, 2006, with its excerpt English translation. Korean Patent Laid-Open Publication No. 2003-2182, dated Jan. 8, 2003, with its English Abstract and complete English translation. Japanese Patent Laid-Open Publication No. Sho 63-148597, dated Jun. 21, 1988, with its full English translation.

Japanese Patent Laid-Open Publication No. 2001-217072, dated Aug. 10, 2001, with its English Abstract. Office Action for corresponding Korean Patent Application No. 10-2004-76414, mailed Apr. 25, 2006, with its excerpt English translation. Office Action for corresponding Korean Patent Application No. 10-2004-76977, mailed Apr. 25, 2005, with its excerpt English translation.

Office Action dated Jun. 26, 2006 for related U.S. Appl. No. 10/954,092 (Our ref. YKI-0164).

Partial Translation of Section 3 of Technical Document of Molecular Electronics and Bioelectronics discussed in Third Seminar given in (1993), entitled "elements Having Optical Cavity Structure."

Japanese Patent Laid-Open Publication No. Hei 6-275381 and its English abstract.

Office Action for related U.S. Appl. No. 10/854,092, dated Jan. 6, 2006.

"Study of Organic EL Materials and Devices From Basis to Frontier" from Molecular Electronics and Bioelectronics, Dec. 16, 17, 1993, pp. 135-143.

Office Action for U.S. Appl. No. 10/953,667 mailed Mar. 26, 2007.

United States Office Action for U.S. Appl. No. 10/953,667 mailed May 15, 2008.

Office Action for U.S. Appl. No. 11/156,961 (YKI-0180) dated Sep. 19, 2008.

Office Action for related U.S. Appl. No. 10/954,092, dated Jan. 6, 2006.

* cited by examiner

ORGANIC EL ELEMENT AND ORGANIC EL PANEL

CROSS-REFERENCE TO RELATED APPLICATIONS

The priority Japanese application No. 2003-342663 upon which this patent application is based is hereby incorporated by reference.

BACKGROUND OF THE INVENTION

1. Field of the Invention

The present invention relates to an organic EL element which comprises a transparent electrode, an organic emissive layer disposed over the transparent electrode, and a counter electrode disposed over the organic emissive layer, and emits light when a voltage is applied between the transparent electrode and the counter electrode.

2. Description of the Related Art

In recent years, organic electroluminescence (hereinafter referred to as "EL") displays have gained attention as one type of flat display which would replace liquid crystal displays in the coming generation. In a display panel of an organic EL display (hereinafter referred to as "organic EL panel"), the color of light emitted from each pixel may be determined depending on the emissive material used in the organic emissive layer of each pixel. By allowing the pixels to emit light of different colors using different emissive materials, RGB indication can be achieved.

However, when employing this method, the panel manufacturing process becomes difficult and complex because measures must be effected to compensate for differences in emissive efficiency of the emissive materials for different colors, and steps for applying different emissive materials to corresponding pixels must be carried out separately.

In order to achieve full color indication, other methods for determining pixel colors are proposed. In such methods, light of a single color alone is initially emitted, and color filters or color conversion layers are employed to obtain light of other colors. However, according to these methods, it is difficult to achieve sufficient emissive efficiency for each color.

Another alternative method using microcavities is disclosed in the following document: Takahiro NAKAYAMA and Atsushi KADOTA, "Element Incorporating Optical Resonator Structure, Third Meeting (1993)", in "From the Basics to the Frontiers in the Research of Organic EL Materials and Devices", Dec. 16 and 17, 1993, Tokyo University Sanjo Conference Hall, Japan Society of Applied Physics, Organic Molecular Electronics and Bioelectronics Division, JSAP Catalog Number AP93 2376, p. 135-143. According to this method, a microcavity which functions as a microresonator is provided in each pixel to extract light having a specific wavelength. Using this microresonator, light having a specific wavelength can be selectively intensified.

However, the method using a conventional microresonator has a drawback in that unevenness is generated within a displayed color.

Upon examining this problem, it was discovered that the structure constituting a microresonator includes portions at which the optical length is non-uniform, which obstruct color selection being performed in an appropriate manner.

SUMMARY OF THE INVENTION

An advantage of the present invention is that negative influences from insufficient optical selectivity of microresonators can be eliminated.

According to the present invention, a light-shielding film is provided to eliminate undesirable light components from among light ejected from a microresonator (microcavity). Using this arrangement, disadvantages caused when using microresonators can be overcome.

DESCRIPTION OF THE PREFERRED EMBODIMENTS

Figure 1:
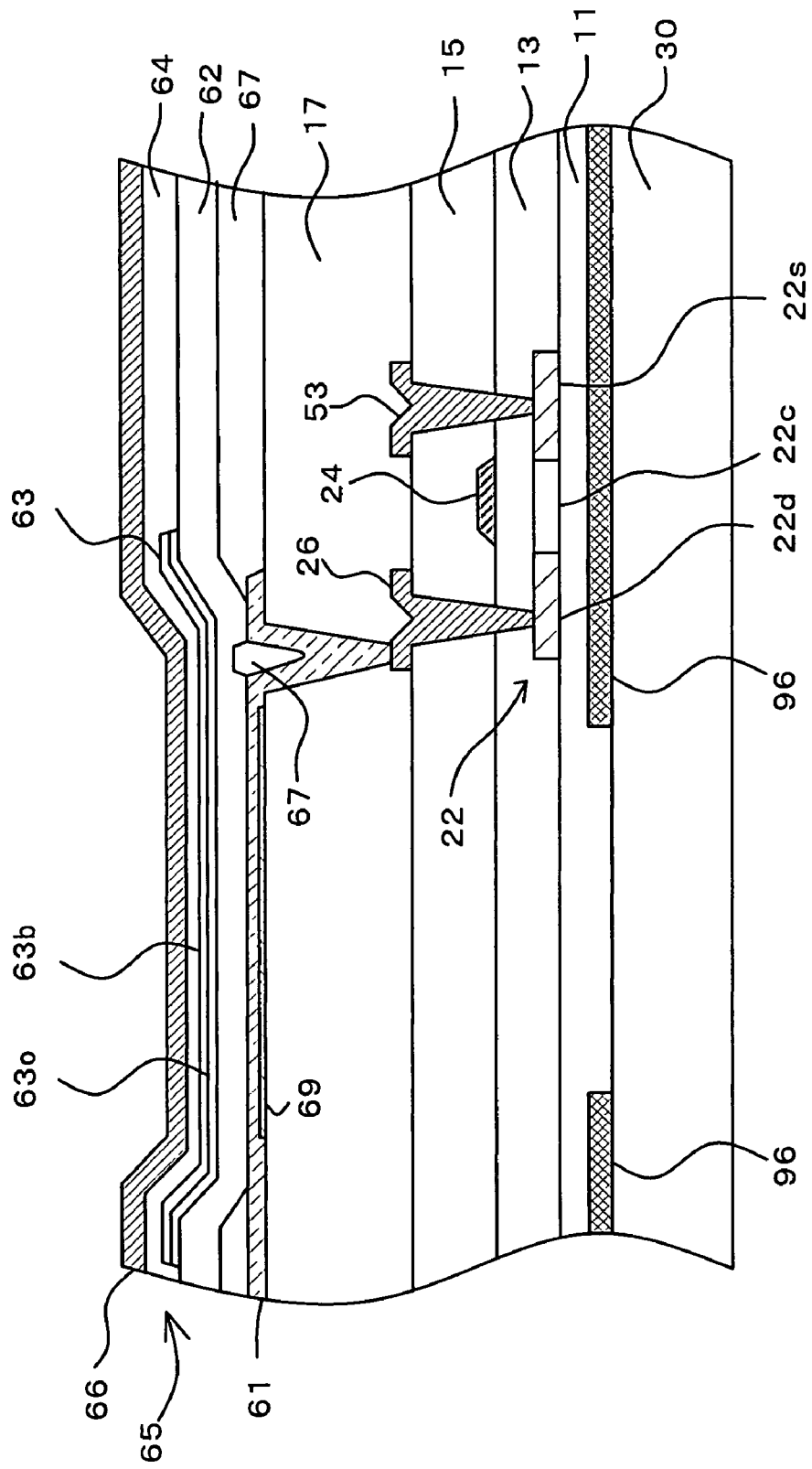
FIG. 1 is a cross-sectional view showing an example configuration of a pixel portion of an organic EL panel according to the present invention.

Preferred embodiments of the present invention will next be described referring to the drawings.

FIG. 1 is a cross-sectional view showing a configuration of a light-emitting region and a drive TFT (thin film transistor) within one pixel. It should be noted that each pixel actually includes a plurality of TFTs. The drive TFT is the TFT which controls a current supplied from a power line to an organic EL element within the pixel.

On a glass substrate 30, a light-shielding film 96 is formed to cover the peripheral portion of the light-emitting region. The light-shielding film 96 may be composed of various materials such as those used for a black matrix in an LCD. Examples of materials that can be used for the light-shielding film 96 include a black material formed of chromium, a resist obtained by mixing a black pigment or dye in a resist (photosensitive resin), and a resin material obtained by dispersing a black pigment in a polymer.

Covering the glass substrate 30 and the light-shielding film 96, a buffer layer 11 composed of a lamination of an SiN layer and an $SiO_2$ layer is formed over the entire surface. Further on top, an active layer 22 made of polysilicon is disposed in predetermined areas (where TFTs are to be created).

Covering the active layer 22 and the buffer layer 11, a gate insulation film 13 is formed over the entire surface. The gate insulation film 13 may be formed by laminating an $SiO_2$ layer and an SiN layer. On top of the gate insulation film 13 at a position above a channel region 22c, a gate electrode 24 composed of chromium or the like is arranged. Subsequently, impurities are doped into the active layer 22 while using the gate electrode 24 as a mask. As a result of this process, in the active layer 22, the channel region 22c without impurities is provided in the central portion under the gate electrode 24, while a source region 22s and a drain region 22d doped with impurities are formed on both sides of the channel region 22c.

Next, covering the gate insulation film 13 and the gate electrode 24, an interlayer insulation film 15 is formed over the entire surface. Contact holes are then created in the interlayer insulation film 15 at positions corresponding to the source region 22s and the drain region 22d located under the interlayer insulation film 15. Subsequently, a source electrode 53 and a drain electrode 26 are provided through these contact holes and on the upper surface of the interlayer insulation film 15, so as to connect with the source region 22s and the drain region 22d, respectively. It should be noted that the source electrode 53 is connected to a power line (not shown). While the drive TFT formed as described above is a p-channel TFT in this example, the drive TFT may alternatively be constituted as an n-channel TFT.

Covering the interlayer insulation film 15, source electrode 53, and drain electrode 26, a planarization film 17 is provided over the entire surface. On top of the planarization film 17 at the position of the light-emitting region, a semi-transmissive film 69 composed of a thin film of Ag or the like is formed. A transparent electrode 61 which serves as an anode is then disposed on the semi-transmissive film 69. At a position above the drain electrode 26, a contact hole is created through the planarization film 17. Via this contact hole, the drain electrode 26 and the transparent electrode 61 are connected.

While an organic film such as acrylic resin is typically used to form the interlayer insulation film 15 and planarization film 17, it is also possible to employ TEOS or an inorganic film. A metal such as aluminum may be favorably used to create the source electrode 53 and drain electrode 26. For the transparent electrode 61, ITO is typically employed.

The transparent electrode 61 is typically formed in a region covering more than half of the entire area of each pixel. The transparent electrode 61 normally has a substantially rectangular overall shape with a contacting portion protruding laterally and downward through the contact hole for connection with the drain electrode 26. As can be seen in FIG. 1, the semi-transmissive film 69 is formed slightly smaller than the anode 61.

On top of the transparent electrode 61, an organic layer 65 and a counter electrode 66 are arranged. The organic layer 65 comprises a hole transport layer 62 formed over the entire surface, an organic emissive layer 63 formed slightly larger than the light-emitting region, and an electron transport layer 64 formed over the entire surface. The counter electrode 66, which serves as a cathode, is made of metal such as aluminum, and is formed over the entire surface.

At a position on the upper surface of the peripheral portion of the transparent electrode 61 and underneath the hole transport layer 62, a planarization film 67 is provided. The planarization film 67 limits the portion in which the hole transport layer 62 directly contacts the transparent electrode 61, thereby defining the light-emitting region in each pixel. Further, a part of the planarization film 67 is also formed in a concavity generated in the contacting portion of the transparent electrode 61, so as to planarize the transparent electrode 61. It should be noted that, while an organic film such as acrylic resin is typically used for the planarization film 67, it is also possible to employ TEOS or an inorganic film.

The hole transport layer 62, the organic emissive layer 63, and the electron transport layer 64 are composed of materials that are conventionally used in an organic EL element. The color of emitted light is determined depending on the material (usually the dopant) of the organic emissive layer 63. For example, the hole transport layer 62 may be composed of NPB, the organic emissive layer 63 for emitting red light may be composed of TBADN+DCJTB, the organic emissive layer 63 for emitting green light may be composed of $Alq_3$+CFD-MQA, the organic emissive layer 63 for emitting blue light may be composed of TBADN+NPB, and the electron transport layer 64 may be composed of $Alq_3$.

In the above-described arrangement, when the drive TFT is turned on by a voltage set in the gate electrode 24, current from the power line flows from the transparent electrode 61 to the counter electrode 66. This current causes light emission in the organic emissive layer 63. The emitted light passes through the transparent electrode 61, planarization film 17, interlayer insulation film 15, gate insulation film 13, and glass substrate 30, to be ejected downward in FIG. 1.

In the present embodiment, a semi-transmissive film 69 composed of a thin film of silver (Ag) or the like is provided on the underside of the transparent electrode 61 at the position of the light-emitting region. Accordingly, light generated in the organic emissive layer 63 is reflected by the semi-transmissive film 69. Because the counter electrode 66 functions as a reflective layer, the light is repetitively reflected between the semi-transmissive film 69 and the counter electrode 66.

The interval structure between the semi-transmissive film 69 and the counter electrode 66 is configured such that this interval optically functions as a microresonator for a specific color. In other words, the optical length of the interval is set to a value obtained by multiplying the wavelength of a desired color by an integer or a reciprocal of an integer (such as ½, 1, and 2). For example, the values of refractive index for the materials constituting each layer in the interval may be approximately as follows: 1.9 for ITO constituting the transparent electrode 61; 1.46 for $SiO_2$ constituting the gate insulation film 13; 2.0 for SiN also used for the gate insulation film 13; and 1.7 for the organic layer 65 including the organic emissive layer 63. By multiplying the physical thickness of each layer between the semi-transmissive film 69 and the counter electrode 66 by a corresponding refractive index, and then summing the calculated values, the optical thickness of the interval can be obtained. In the present embodiment, this optical thickness is set to a value relative to the wavelength of light to be extracted. With this arrangement, the interval between the semi-transmissive film 69 and the counter electrode 66 functions as a microresonator, and enables efficient extraction of light having a desired wavelength. More specifically, light emitted from the organic emissive layer 63 is repetitively reflected between the semi-transmissive film 69 and the counter electrode 66, and, as a result, light components having a specific wavelength are selectively passed through the semi-transmissive film 69. By further repeating such reflection within the microresonator, the probability that light having the specific wavelength will be ejected can be increased, resulting in enhanced efficiency.

According to the present embodiment, the light-shielding film 96 is provided between the glass substrate 30 and the buffer layer 11, so as to cover the peripheral portion of the light-emitting region. Because a microresonator selects light in accordance with the optical length of the microresonator, the wavelength of selected light becomes varied when the optical length is not uniform. At the edge portions of the semi-transmissive film 69, differences in thickness of the transparent electrode 61 are likely to be generated due to level differences, which in turn create differences in the distance from the semi-transmissive film 69 to the counter electrode 66. Furthermore, at the portions in which the layers between the semi-transmissive film 69 and the counter electrode 66 are sloped, the optical length cannot be precisely controlled. By providing the light-shielding film 96 in these portions, ejection of light having different colors can be effectively prevented. In the present embodiment, the light-shielding film 96 is also provided below the drive TFT. This arrangement prevents external light from irradiating on the drive TFT to possibly cause erroneous operation of the drive TFT.

It should be noted that the position of the light-shielding film 96 is not limited to the top of the glass substrate 30. The light-shielding film 96 may be formed on an SiN film additionally deposited on the interlayer insulation film 15. Alternatively, the light-shielding film 96 may be formed on the underside of the glass substrate 30.

Figure 2:
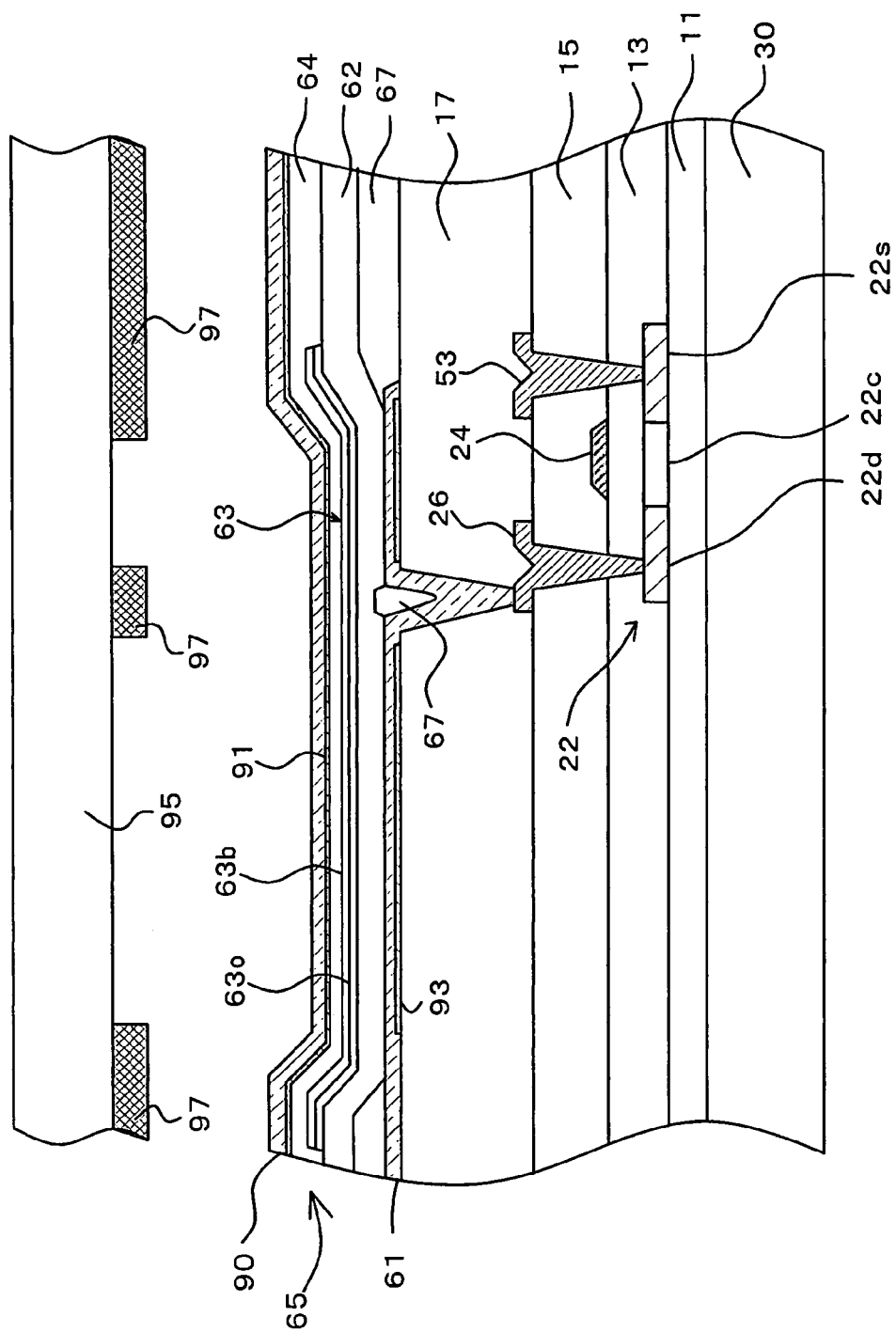
FIG. 2 is a cross-sectional view showing another example configuration of the pixel portion.

FIG. 2 shows a configuration of a portion of a top emission type pixel. In this embodiment, a transparent cathode 90 composed of ITO is provided as the cathode. Further, a semi-transmissive film 91 is disposed on the underside of the transparent cathode 90.

Furthermore, a metal reflective layer 93 is formed under the transparent electrode 61. The interval structure between the surface of the metal reflective layer 93 and the semi-transmissive film 91 functions as the microresonator.

In this embodiment, the light-shielding film 97 is provided on the underside of a sealing substrate 95. Similarly as in the above-described bottom emission type embodiment, the light-shielding film 97 is arranged to cover portions at which the optical length of the microresonator tends to be varied. In the present embodiment, as can be seen in FIG. 2, the light-shielding film 97 is not only provided at the peripheral portion of the light-emitting region, but also at a position corresponding to the contacting portion of the transparent electrode 61.

It should be noted that the sealing substrate 95 connects to the substrate 30 at its peripheral portion alone, and serves to seal the upper space of the substrate 30 having components such as the organic EL element formed thereon.

Figure 3:
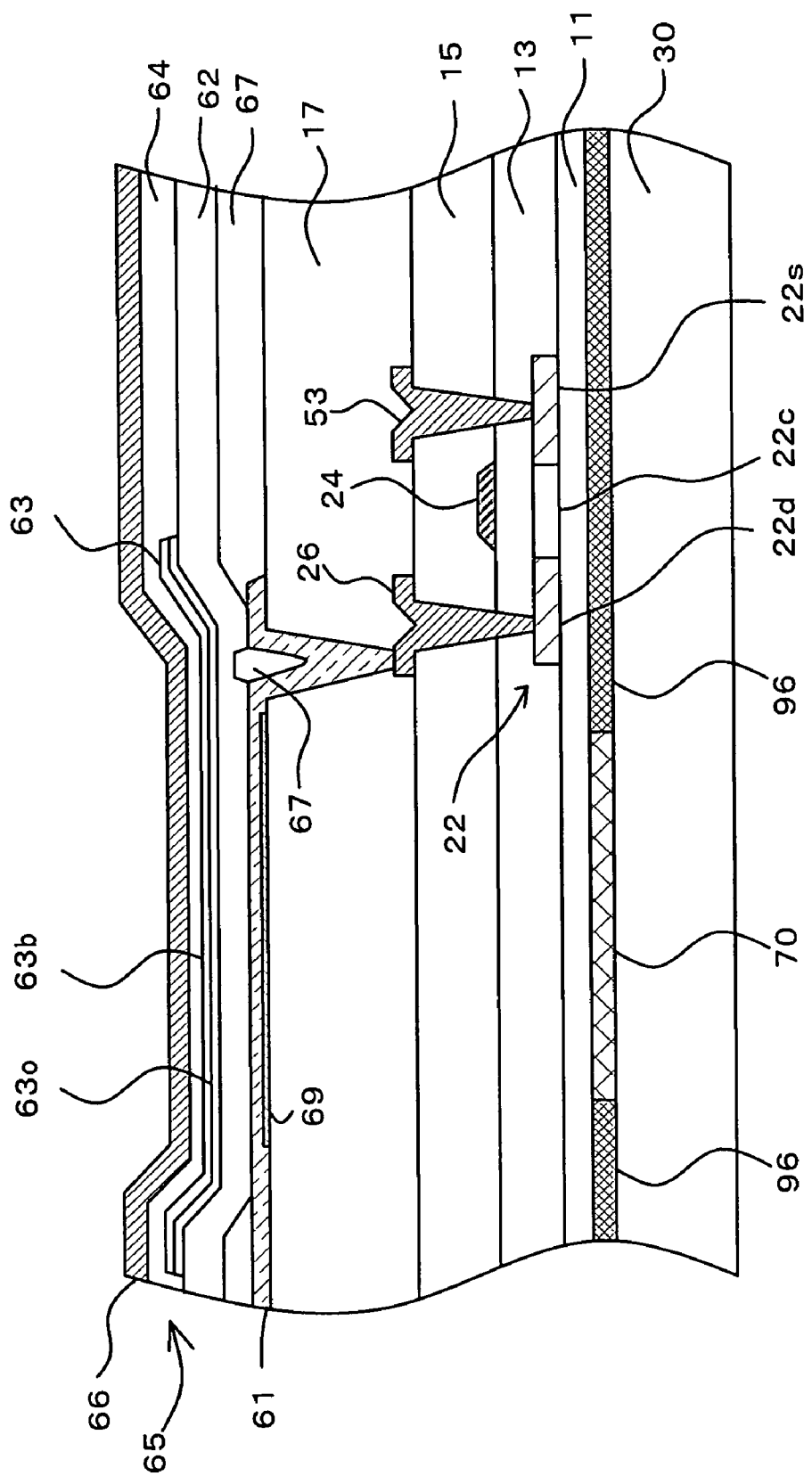
FIG. 3 is a cross-sectional view showing the configuration of FIG. 1 further provided with a color filter.

FIG. 3 shows the configuration of FIG. 1 further including a color filter 70 arranged at a position corresponding to the light-emitting region and adjacent to the light-shielding film 96. As described above, by using the microresonator, light having a specific wavelength can be selected. However, the microresonator basically regulates only the wavelength of light that is incident from a direction perpendicular to the surface of the semi-transmissive film 69. Accordingly, the wavelength of light ejected from the microresonator is highly dependent on the viewing direction, such that different colors would likely be detected when the panel is viewed at an angle. By providing the color filter 70 as in the present embodiment to pass the ejected light through the color filter 70, the obtained light would unfailingly have a specific wavelength. In this manner, the viewing angle dependency of the panel can be substantially eliminated.

The position of the color filter 70 is not limited to the top of the glass substrate 30. The color filter 70 may be formed on an SiN film additionally deposited on the interlayer insulation film 15. Alternatively, the color filter 70 may be formed on the underside of the glass substrate 30. In order to simplify the manufacturing process, the color filter 70 is preferably formed in the same layer as the light-shielding film 96.

Figure 4:
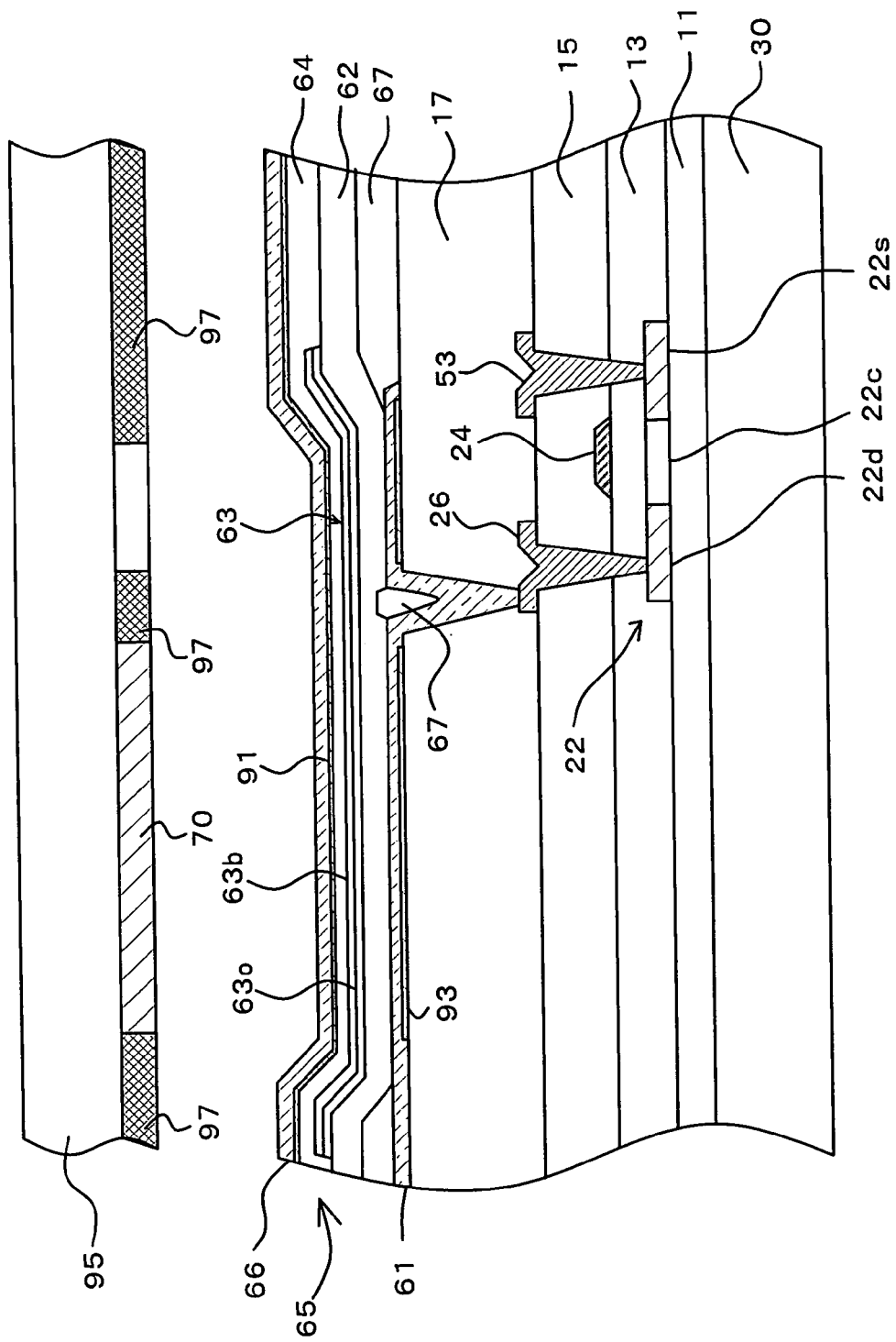
FIG. 4 is a cross-sectional view showing the configuration of FIG. 2 further provided with a color filter.

FIG. 4 shows a configuration for the top emission type including a color filter 70. The color filter 70 is provided on the underside of the sealing substrate 95 and adjacent to the light-shielding film 97.

In the above-described embodiments, the organic emissive layer 63 is composed of two layers 63o and 63b for emitting orange and blue light, and the color of light emitted from the overall organic emissive layer 63 is white. Even when the organic emissive layer is a single-color emissive layer which emits any one of R, G, or B color, it is similarly preferable to configure a microresonator and provide a light-shielding film in a position corresponding to portions at which the optical length of the microresonator may be varied, as in the above embodiments.

While the TFTs in the above embodiments are described as top gate type TFTs, bottom gate type TFTs may alternatively be used.

Figure 5:
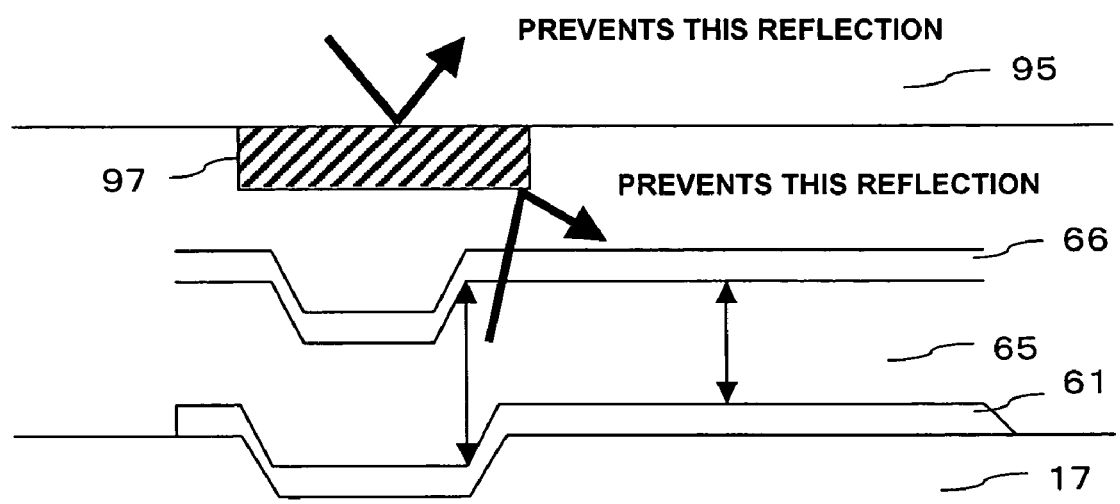
FIG. 5 is a diagram explaining functions of the light-shielding film.

FIG. 5 diagrammatically explains the functions of the light-shielding film 96 with reference to a top emission type panel. The transparent electrode 61 serving as the pixel electrode is formed in a predetermined region (light-emitting region) on the planarization film 17. The planarization film 17 includes a concavity (uneven portion) generated in correlation with structures such as the TFT formed underneath the planarization film 17. As a result, a concavity is also generated in the transparent electrode 61, organic layer 65, and counter electrode 66 disposed on top of the planarization film 17.

Due to this concavity, the optical length between the transparent electrode 61 and the counter electrode 66 becomes non-uniform, as shown by the double-ended arrows in FIG. 5.

According to the present embodiment, the light-shielding film 97 is provided so as to prevent light reflected by the concavity from being included in the ejected light (as shown by the lower bold arrow in FIG. 5). The light-shielding film 97 may be designed to additionally prevent reflection of external light (as shown by the upper bold arrow in FIG. 5). The function of preventing reflection can be achieved by employing a material such as chromium oxide ($CrO_2$) and resin black. For example, the entire light-shielding film 96 may be composed of resin black.

It should be noted that examples of portions at which the optical length of a microresonator may be varied include a portion around a contact hole as described above and a peripheral portion of a pixel.

What is claimed is:

1. An organic EL panel comprising a plurality of organic EL elements each including an organic layer provided between first and second electrodes and emitting light when a voltage is applied between the first and second electrodes to allow a current to flow in the organic layer, wherein
the first electrode includes a semi-transmissive layer which reflects light emitted from the organic layer;
the second electrode includes a reflective layer for reflecting light emitted from the organic layer;
an interval between the reflective layer and the semi-transmissive layer is configured to have a predetermined optical length, such that, when light generated in the organic layer is repetitively reflected between the reflective layer and the semi-transmissive layer, the interval between the reflective layer and the semi-transmissive layer functions as a microresonator which intensifies and selects light having a specific wavelength and ejects the selected light through the semi-transmissive layer;
a light-shielding film which shields light ejected from the microresonator is provided in a position corresponding to a portion of the microresonator having a non-uniform optical length;
the plurality of organic EL elements are formed on a substrate, and a plurality of thin film transistors for controlling supply of current to the plurality of organic EL elements are provided on the substrate;
the thin film transistors and the first electrode are connected via contact holes;
the portion of the microresonator having non-uniform optical length is generated by the existence of the contact hole;
the light shielding is structured to shield light that goes through the portion of the microresonator having non-uniform optical length; and
the light shielding film is superposed on the contact holes.

2. An organic EL panel as defined in claim 1, wherein
the first electrode is a laminated structure composed of the semi-transmissive layer and a transparent electrode; and
the second electrode is a metal electrode which functions as the reflective layer.

3. An organic EL panel as defined in claim 2, wherein among the semi-transmissive layer and the transparent electrode, the transparent electrode is located closer to the organic layer.

4. An organic EL panel as defined in claim 3, wherein the first electrode is an anode, while the second electrode is a cathode.

5. An organic EL panel as defined in claim 1, wherein the plurality of organic EL elements are arranged in a layer above the thin film transistors, and the light-shielding film is positioned in a layer between the thin film transistors and the substrate.

6. An organic EL panel as defined in claim 1, wherein the plurality of organic EL elements are formed on a pixel substrate;

a counter substrate is arranged opposing the pixel substrate; wherein the light shielding film is formed on the counter substrate.

* * * * *